US012593482B2

(12) United States Patent
Germana-Carpineto et al.

(10) Patent No.: US 12,593,482 B2

(45) Date of Patent: Mar. 31, 2026

(54) ELECTRONIC DEVICE COMPRISING TRANSISTORS

(71) Applicants: STMICROELECTRONICS S.r.l., Agrate Brianza (IT); STMICROELECTRONICS (ROUSSET) SAS, Rousset (FR)

(72) Inventors: Rosalia Germana-Carpineto, Antibes (FR); Lia Masoero, Marseilles (FR); Luigi Innacolo, Catania (IT)

(73) Assignees: STMICROELECTRONICS S.r.l., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 643 days.

(21) Appl. No.: 17/960,064

(22) Filed: Oct. 4, 2022

(65) Prior Publication Data

US 2023/0121961 A1 Apr. 20, 2023

(30) Foreign Application Priority Data

Oct. 20, 2021 (FR) ........................................ 2111151

(51) Int. Cl.
*H10D 62/17* (2025.01)
*H01L 21/265* (2006.01)
(Continued)

(52) U.S. Cl.
CPC ..... *H10D 62/393* (2025.01); *H01L 21/26513* (2013.01); *H10D 30/0297* (2025.01);
(Continued)

(58) Field of Classification Search
CPC ............ H10D 30/668; H10D 30/0297; H10D 62/393; H10D 64/01; H10D 64/117; H01L 21/25613
(Continued)

(56) References Cited

U.S. PATENT DOCUMENTS

2003/0080355 A1 5/2003 Shirai et al.
2004/0084722 A1* 5/2004 Yamaguchi .......... H10D 12/421
257/E21.384
(Continued)

FOREIGN PATENT DOCUMENTS

CN 103165603 A 6/2013
CN 103887342 A 6/2014
EP 3855506 A1 7/2021

OTHER PUBLICATIONS

Saxena et al., "Cathode short structure to enhance the robustness of bidirectional power MOSFETs," 2018 IEEE 30th International Symposium on Power Semiconductor Devices and ICs (ISPSD), 2018, pp. 479-482.

*Primary Examiner* — Igwe U Anya

(74) *Attorney, Agent, or Firm* — Seed Intellectual Property Law Group LLP

(57) ABSTRACT

The present disclosure relates to an electronic device comprising a semiconductor substrate and transistors having their gates contained in trenches extending in the semiconductor substrate, each transistor comprising a doped semiconductor well of a first conductivity type, the well being buried in the semiconductor substrate and in contact with two adjacent trenches among said trenches, a first doped semiconductor region of a second conductivity type, covering the well, in contact with the well, and in contact with the two adjacent trenches, a second doped semiconductor region of the second conductivity type more heavily doped than the first semiconductor region, extending in the first semiconductor region, and a third doped semiconductor region of the first conductivity type, more heavily doped than the well, covering the well, in contact with the first region, and extending in the semiconductor substrate in contact with the well.

20 Claims, 15 Drawing Sheets

(51) Int. Cl.

| | |
|---|---|
| *H10D 30/01* | (2025.01) |
| *H10D 30/66* | (2025.01) |
| *H10D 64/00* | (2025.01) |
| *H10D 64/01* | (2025.01) |

(52) U.S. Cl.
CPC .......... *H10D 30/668* (2025.01); *H10D 64/01* (2025.01); *H10D 64/117* (2025.01)

(58) Field of Classification Search
USPC ......................................................... 257/330
See application file for complete search history.

(56) References Cited

U.S. PATENT DOCUMENTS

| 2007/0278568 A1* | 12/2007 | Williams ............. H10D 84/038 |
| | | 257/E29.054 |
| 2008/0265241 A1 | 10/2008 | Foerster |

| 2011/0291186 A1 | 12/2011 | Yilmaz et al. |
| 2013/0075810 A1 | 3/2013 | Hsieh |
| 2014/0084363 A1 | 3/2014 | Pearse et al. |
| 2014/0220761 A1* | 8/2014 | Molloy ................ H10D 64/117 |
| | | 438/430 |
| 2014/0264433 A1* | 9/2014 | Hu ........................ H10D 64/519 |
| | | 438/138 |
| 2015/0263146 A1 | 9/2015 | Ogura et al. |
| 2016/0247916 A1 | 8/2016 | Stefanov et al. |
| 2018/0138273 A1 | 5/2018 | Tsuji |
| 2018/0301553 A1 | 10/2018 | Weyers et al. |
| 2019/0288103 A1 | 9/2019 | Nishiwaki et al. |
| 2019/0305079 A1 | 10/2019 | Osuga et al. |
| 2020/0312975 A1* | 10/2020 | Fukuda ................... G05F 1/463 |
| 2021/0234014 A1 | 7/2021 | Germana-Carpineto |
| 2023/0134063 A1* | 5/2023 | Germana-Carpineto ................... H10D 64/117 |
| | | 438/135 |

* cited by examiner

ELECTRONIC DEVICE COMPRISING TRANSISTORS

CROSS-REFERENCE TO RELATED APPLICATION(S)

This application claims the priority benefit of French patent application number 21/11151, filed on 20 Oct. 2021, entitled "ELECTRONIC DEVICE COMPRISING TRANSISTORS," which is hereby incorporated by reference to the maximum extent allowable by law.

BACKGROUND

Technical Field

The present disclosure generally concerns electronic devices and, more specifically, electronic devices comprising transistors.

Description of the Related Art

In certain electronic devices, field-effect transistors are used in a non-conductive state to block high voltages, typically greater than 10 V, for example, in the order of 40 V, or even greater than 100 V. Such field-effect transistors are generally adapted to blocking a high drain-source voltage only when the drain-source voltage is positive. To obtain a blocking of a voltage that may be positive or negative, it may be necessary to have two field-effect transistors in antiparallel. This may be bulky and costly.

BRIEF SUMMARY

An embodiment provides an electronic device overcoming all or part of the disadvantages of existing electronic devices.

According to an embodiment, the surface area occupied by the field-effect transistors is reduced.

According to an embodiment, the manufacturing cost of the field-effect transistors is reduced.

One embodiment provides an electronic device comprising a semiconductor substrate having a first surface and transistors having their gates contained in trenches extending in the semiconductor substrate, each transistor comprising, in the semiconductor substrate, a doped semiconductor well of a first conductivity type, having the transistor channel forming therein in operation, the well being buried in the semiconductor substrate and in contact with two adjacent trenches among said trenches, a first doped semiconductor region of a second conductivity type, opposite to the first conductivity type, covering the well, in contact with the well, and in contact with the two adjacent trenches, a second doped semiconductor region of the second conductivity type more heavily doped than the first semiconductor region, extending in the first semiconductor region and exposed on the first surface, and a third doped semiconductor region of the first conductivity type, more heavily doped than the well, covering the well, exposed on the first surface, in contact with the first region, and extending in the semiconductor substrate in contact with the well.

According to an embodiment, the second semiconductor region is in contact with the two adjacent trenches.

According to an embodiment, the third semiconductor region is in contact with the two adjacent trenches.

According to an embodiment, the first semiconductor region comprises a first semiconductor sub-region containing the second semiconductor region and at least one second semiconductor sub-region exposed on the first surface and coupling the first semiconductor sub-region to the third semiconductor region, the maximum depth of the first semiconductor sub-region being greater than the maximum depth of the second semiconductor sub-region.

According to an embodiment, each transistor comprises, in the trench containing the gate of the transistor:

a first electrically-insulating layer between the gate (120) of the transistor and the semiconductor well and forming the gate insulator of the transistor;

an electrically-conductive element located in the trench;

a second electrically-insulating layer between the electrically-conductive element and the semiconductor substrate; and a third electrically-insulating layer between the electrically-conductive element and the gate.

According to an embodiment, the second semiconductor regions of the transistors are electrically connected together and the third semiconductor regions of the transistors are electrically connected together.

According to an embodiment, the semiconductor substrate comprises a second surface opposite to the first surface, each transistor further comprising, in the semiconductor substrate, a fourth doped semiconductor region of the second conductivity type, covered with the well, in contact with the well, and a fifth doped semiconductor region of the second conductivity type, more heavily doped than the fourth semiconductor region, and exposed on the second surface.

According to an embodiment, the electronic device comprises a plurality of transistors for each pair of adjacent trenches, at least some of the third semiconductor regions of the transistors being alternated with the second semiconductor regions of the transistors.

According to an embodiment, the wells of two adjacent transistors meet.

An embodiment also provides a method of manufacturing the electronic device as previously defined, wherein the forming of the first semiconductor region comprises a step of forming, by epitaxy, of a doped semiconductor layer of the second conductivity type, and a step of implantation of dopants of the second conductivity type in the semiconductor layer.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

3

Figure 1A:
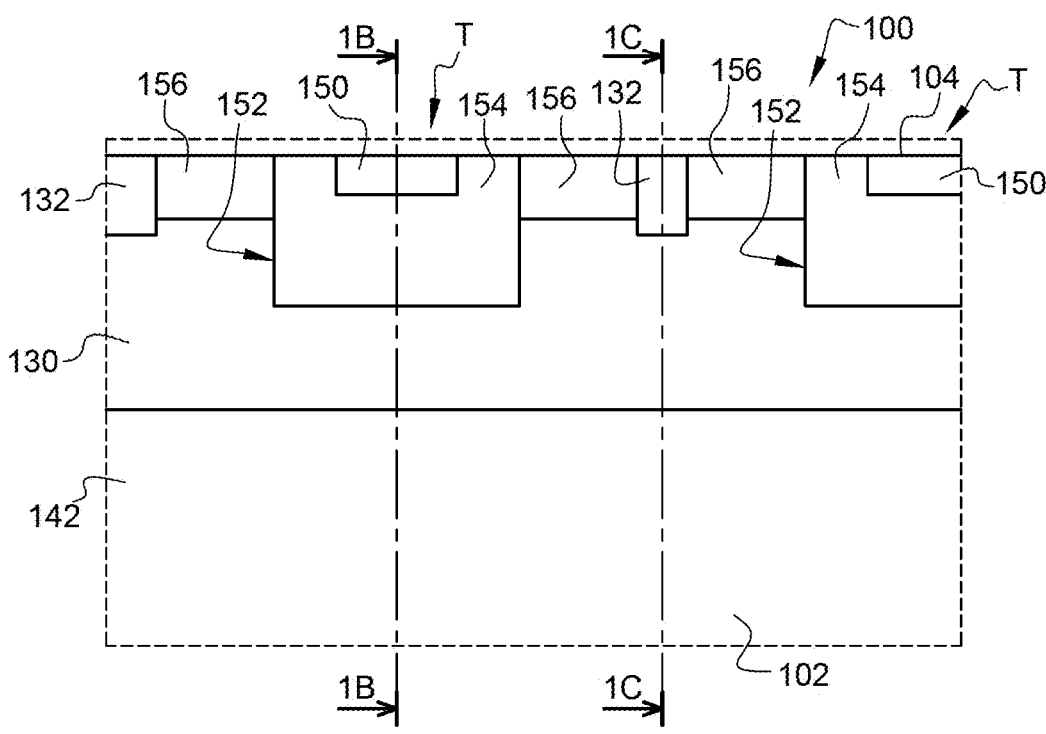
FIG. 1A is a partial simplified lateral cross-section view of an embodiment of an electronic device comprising transistors.
Figure 1B:
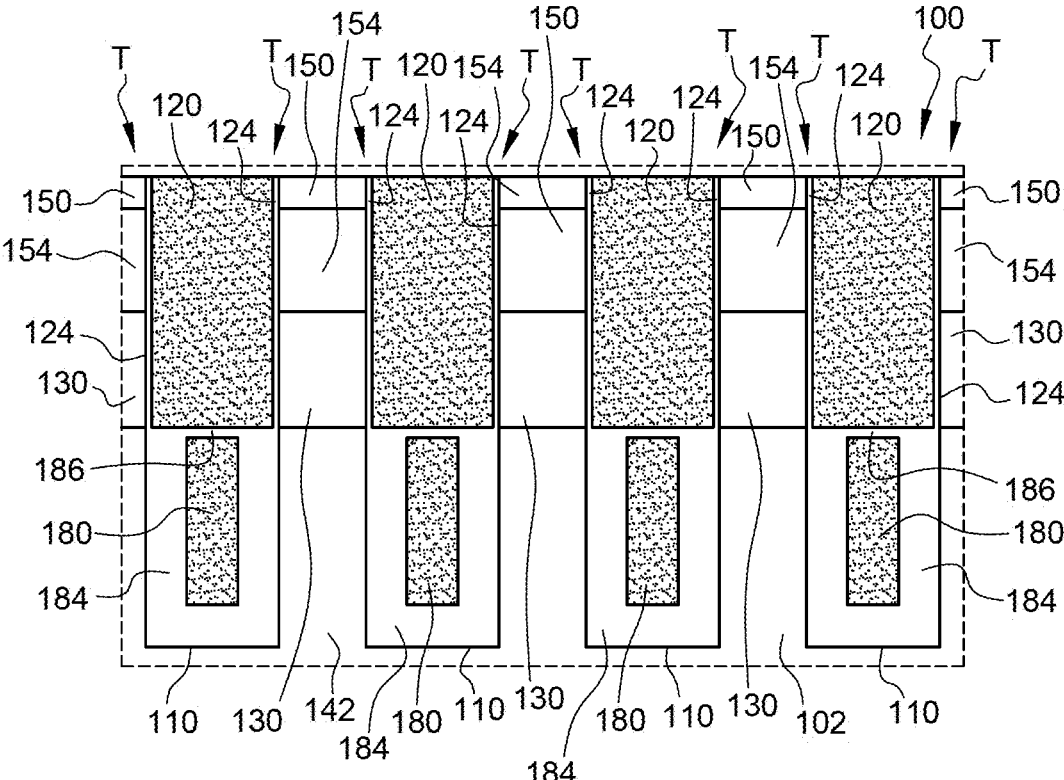
FIG. 1B is another partial simplified lateral cross-section view of the device of FIG. 1A.
Figure 3A:
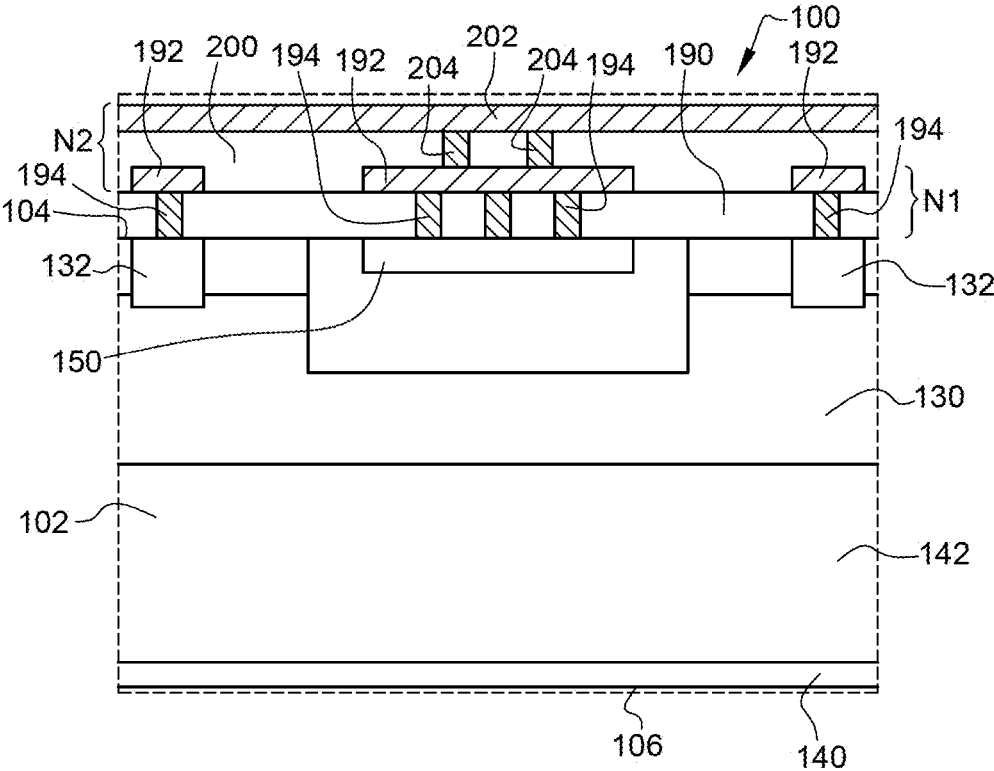
FIG. 3A is a partial simplified lateral cross-section view, similar to FIG. 1A, illustrating an embodiment of the connections of the sources and of the wells of the transistors.
Figure 3B:
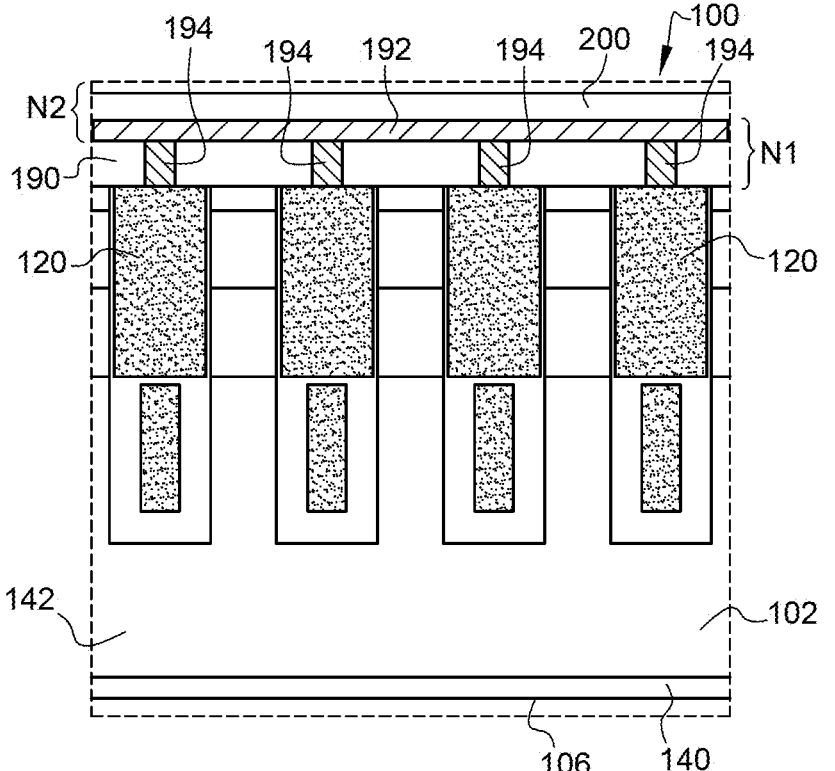
Figure 4:
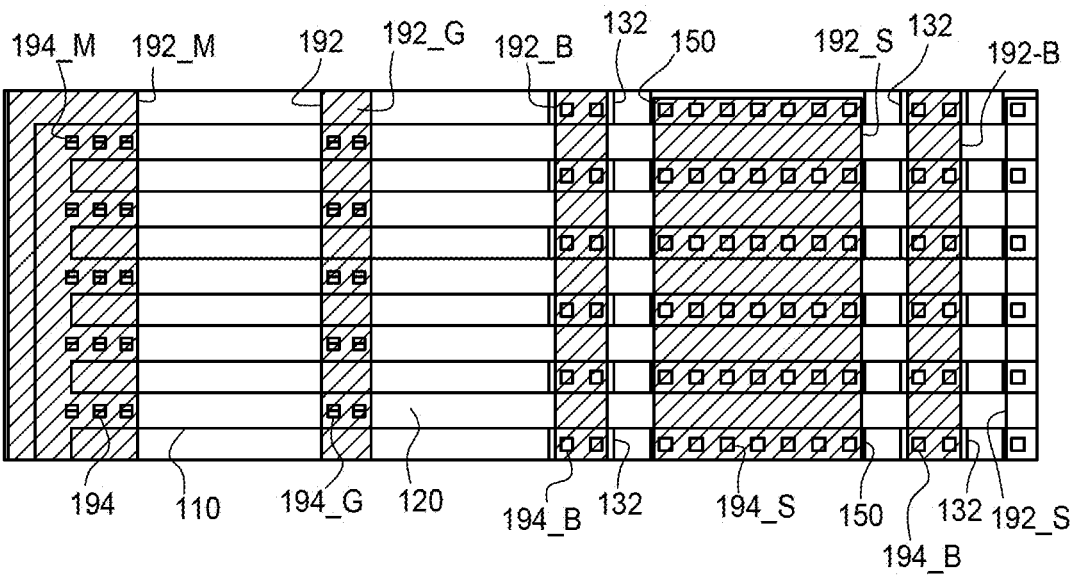
Figure 5:
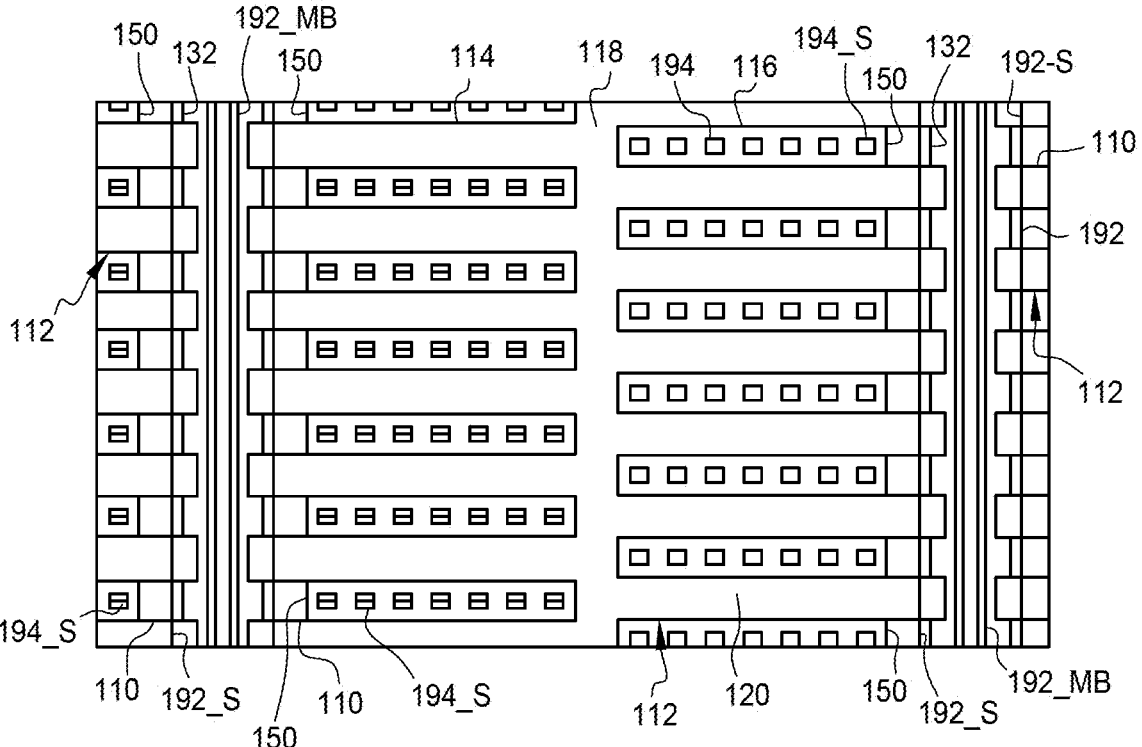
Figures 6, 7, 8:
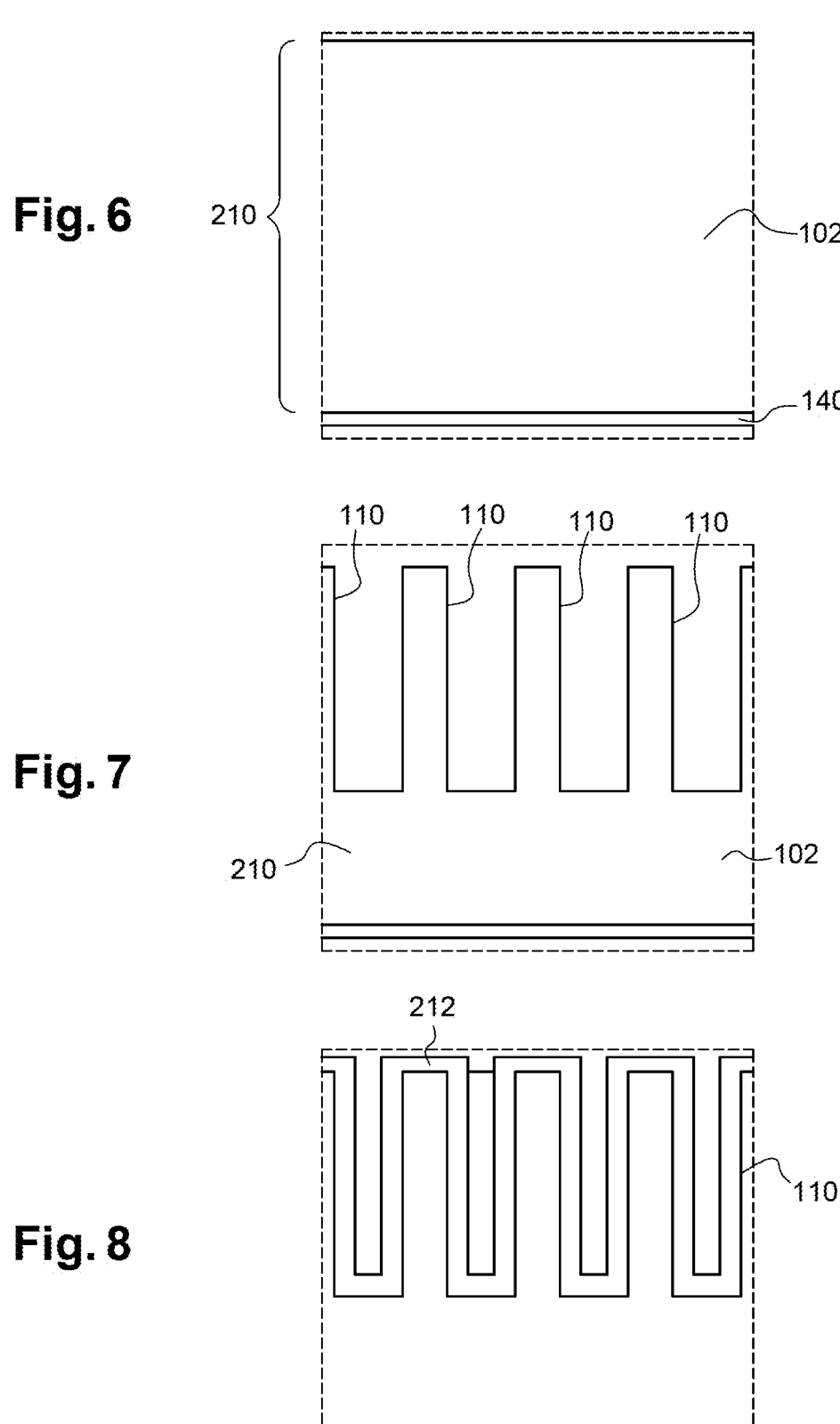
Figures 9, 10, 11:
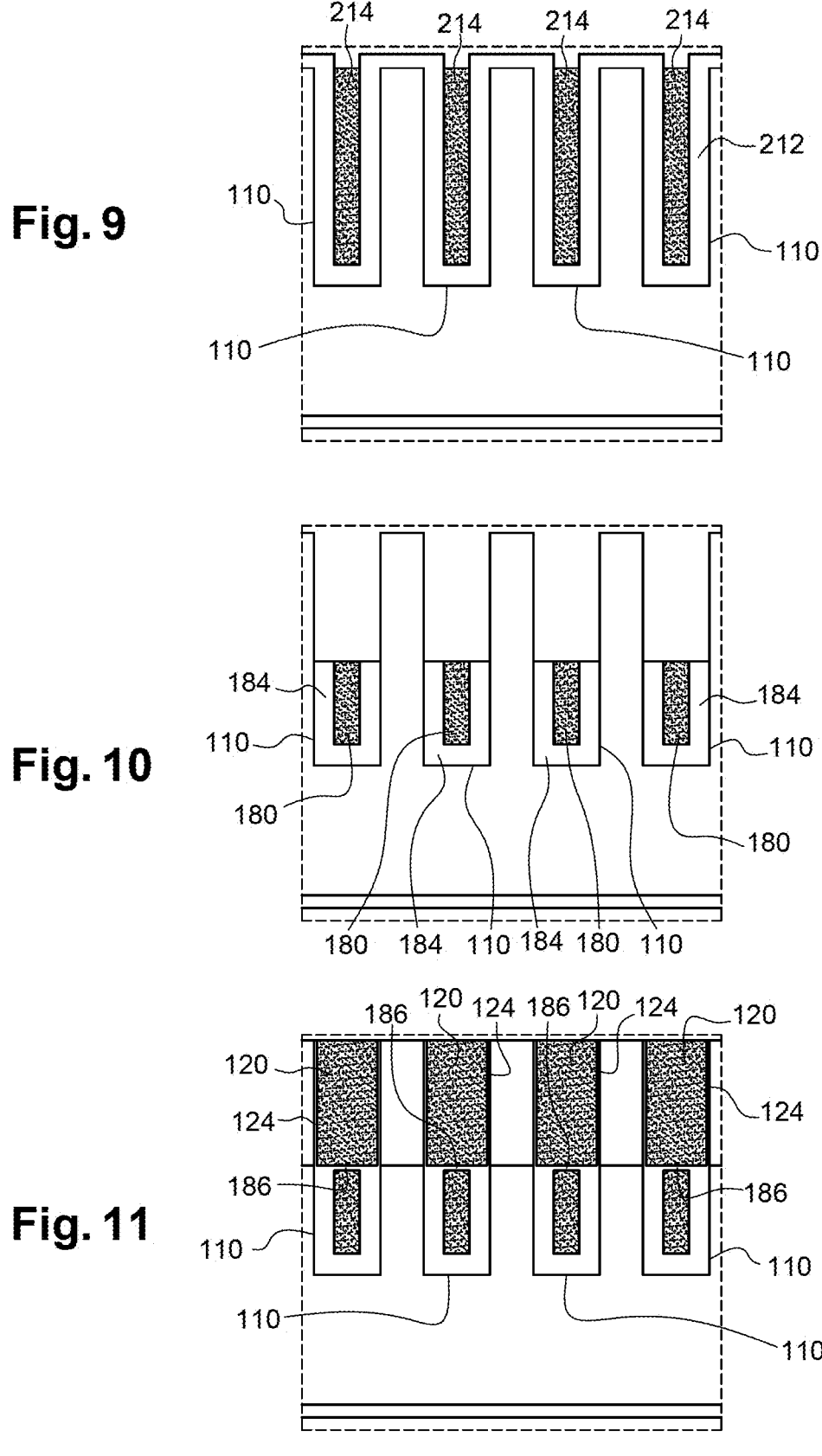
Figure 12:
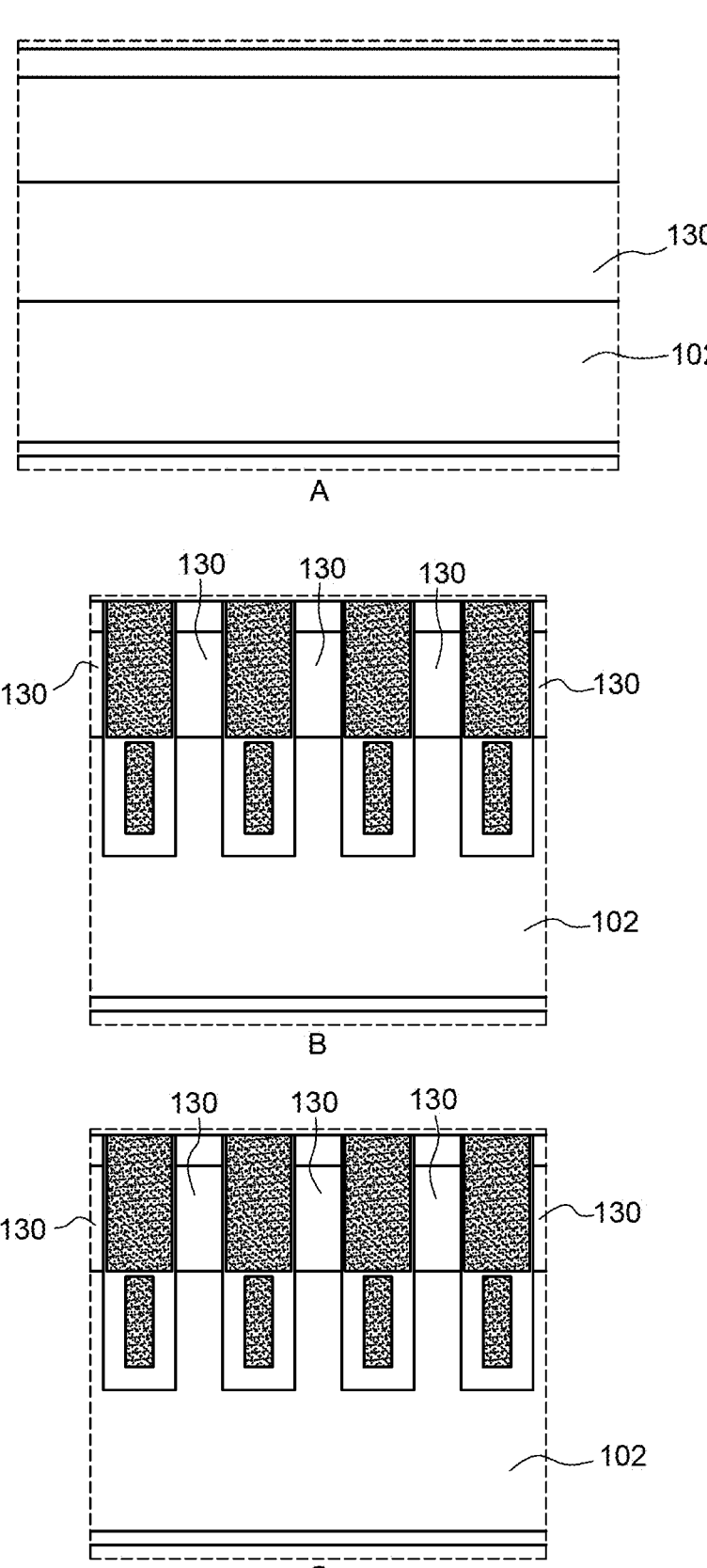
Figure 13:
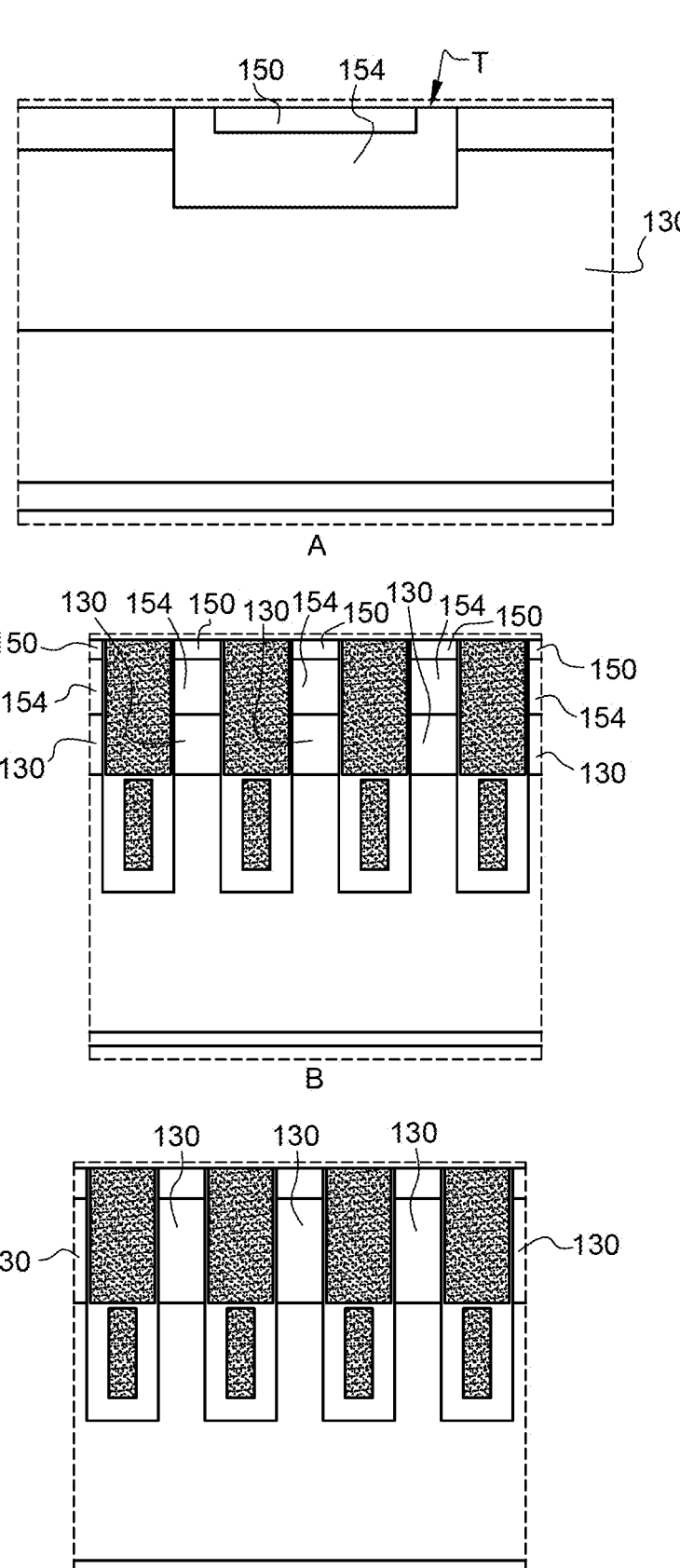
Figure 14:
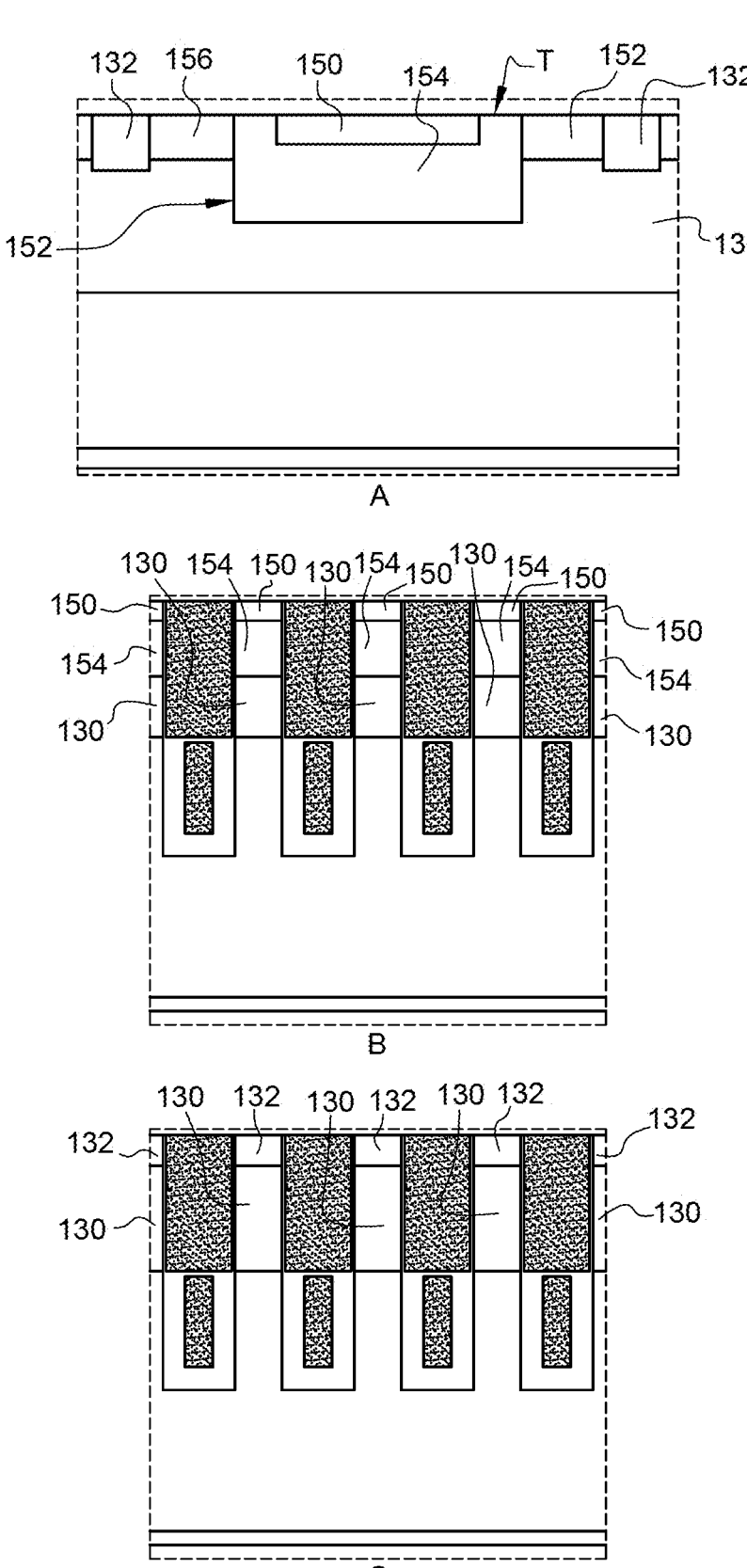
Figure 15:
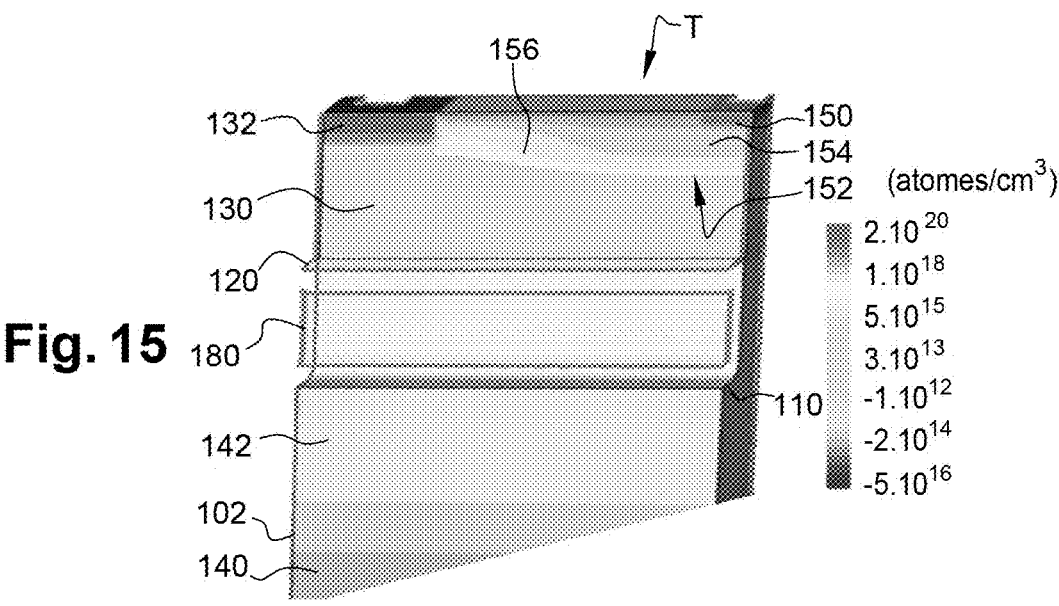
Figure 16:
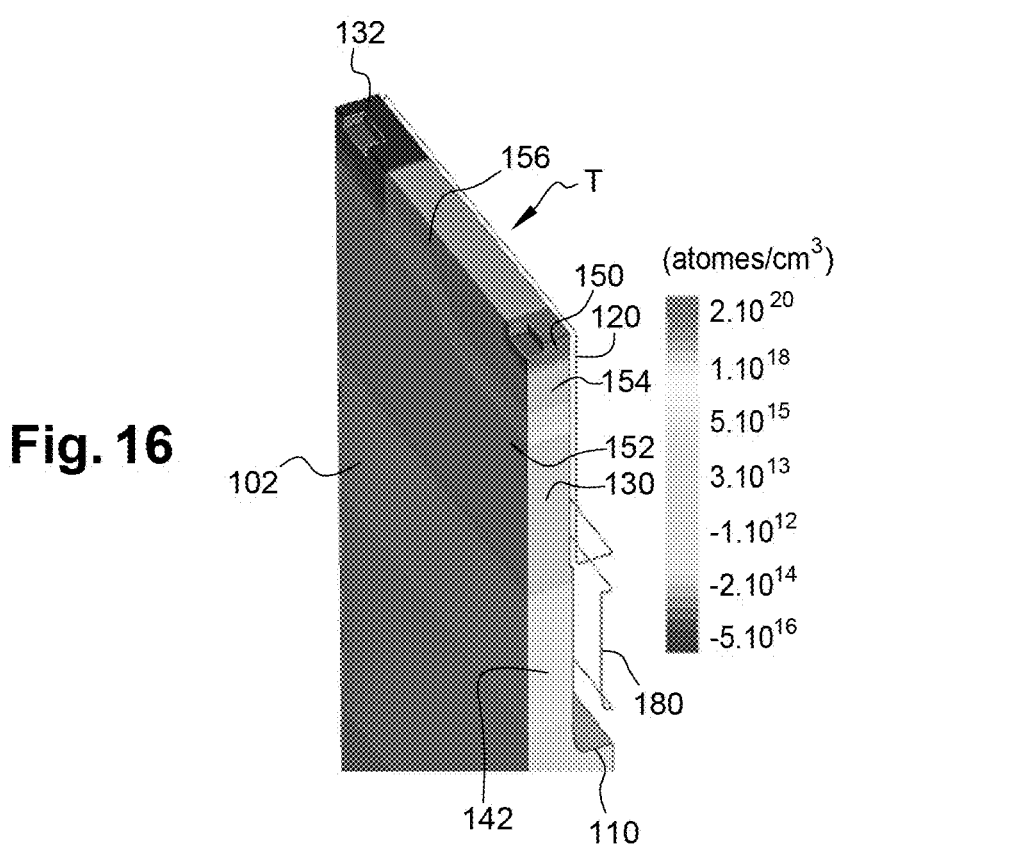
Figure 17:
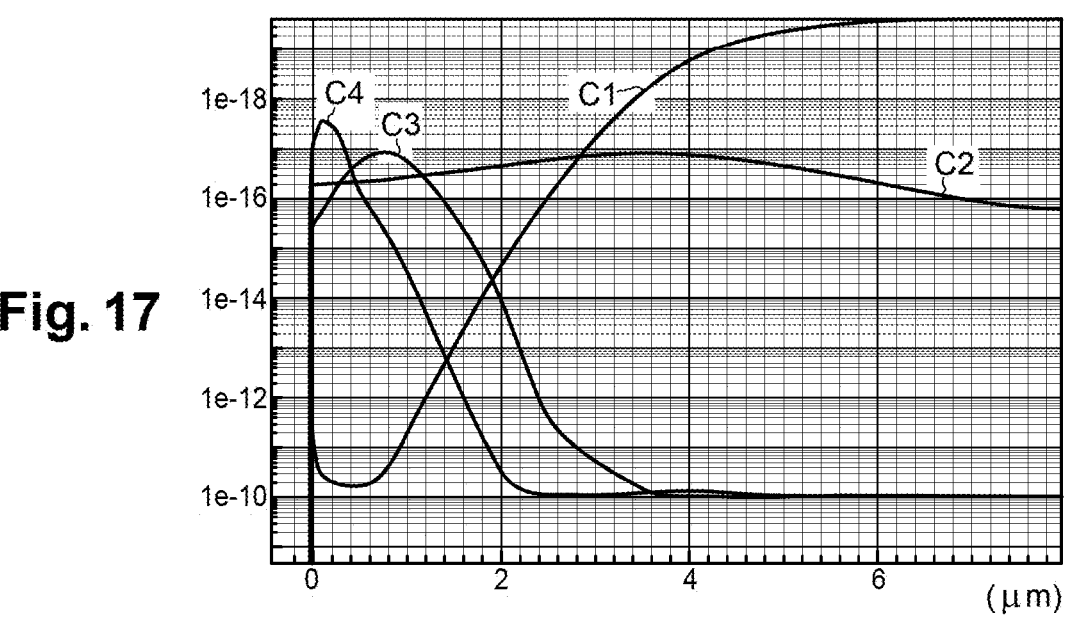
Figure 18:
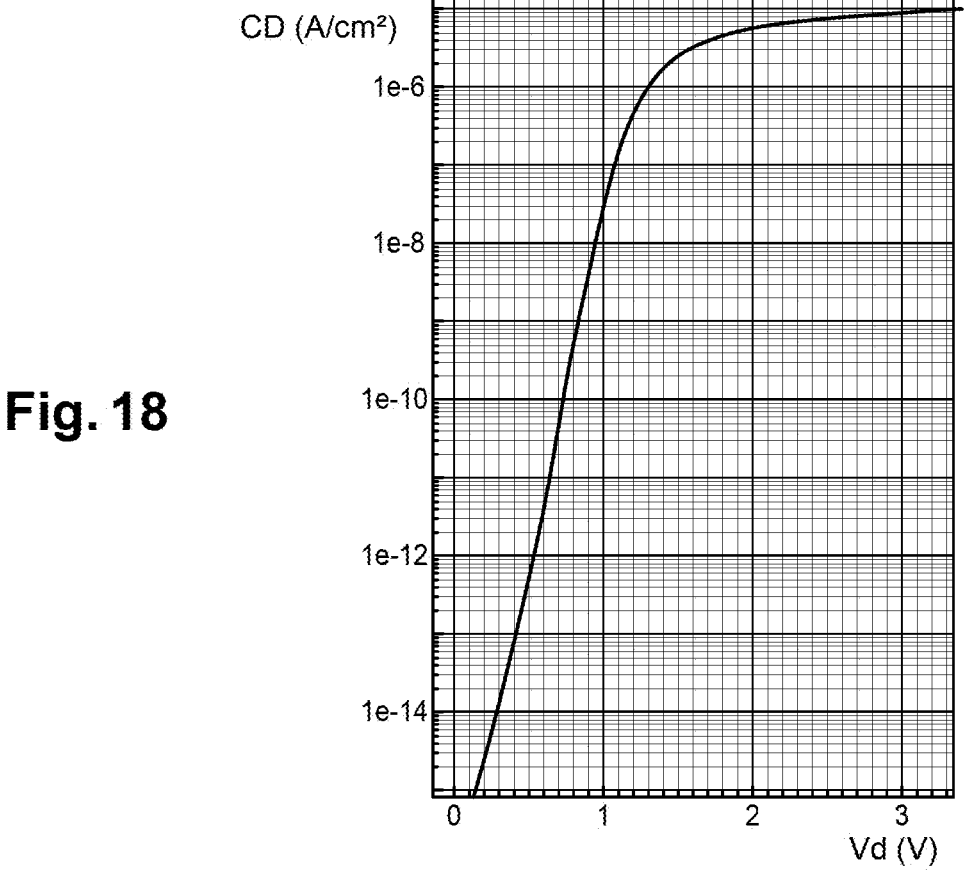
Figure 19:
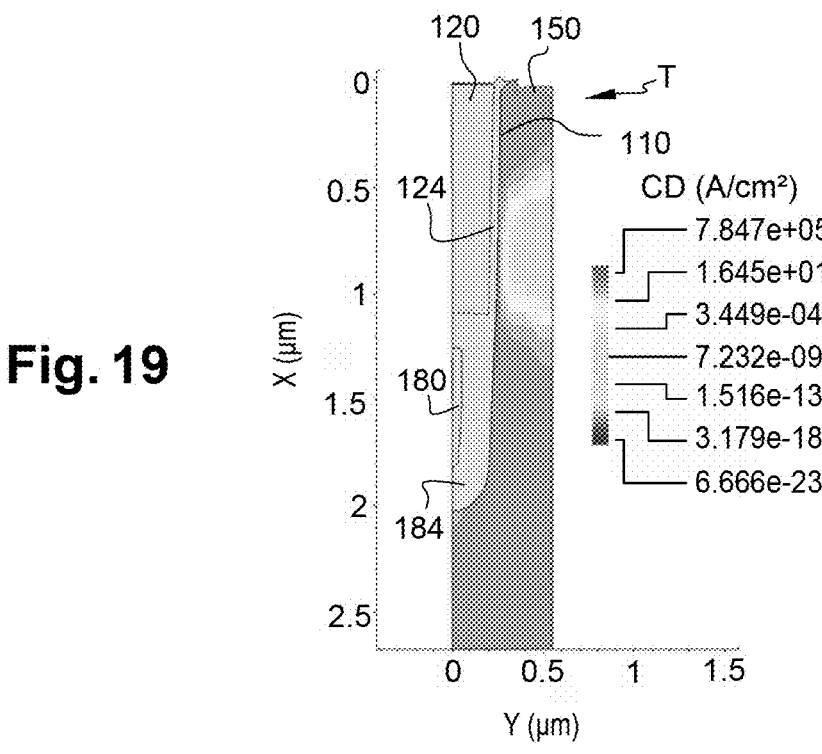
Figure 20:
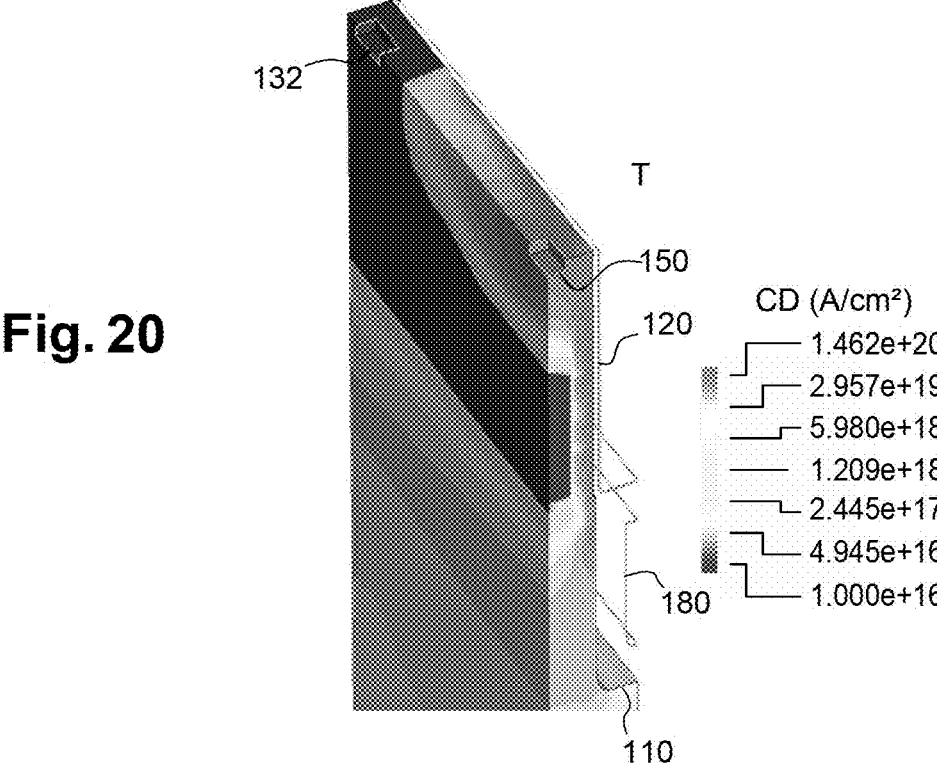
Figure 21:
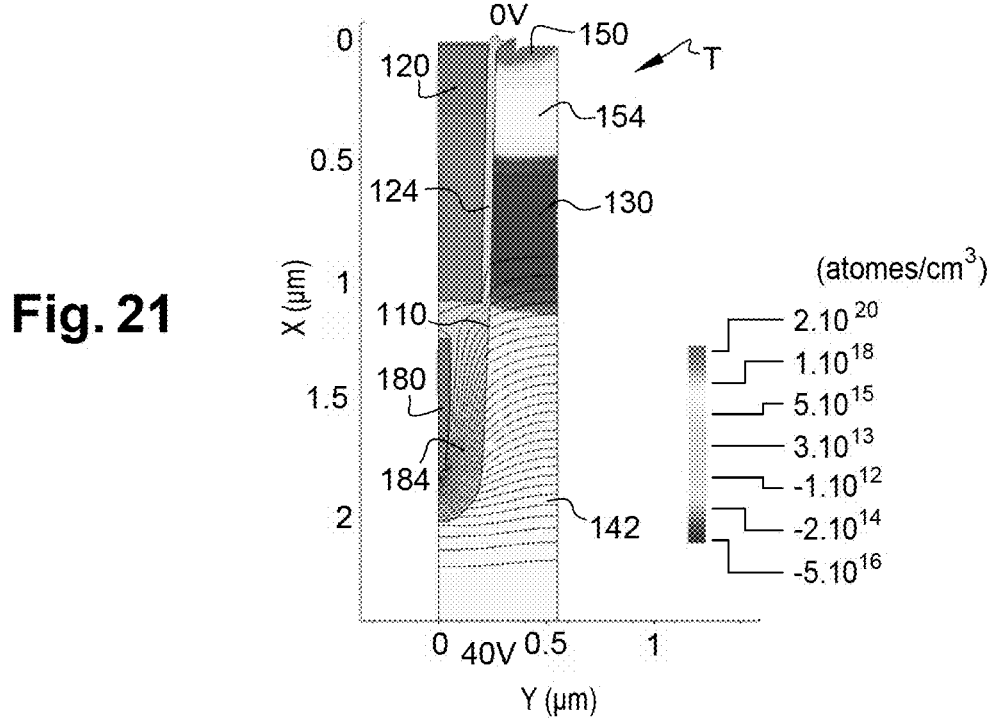
Figure 22:
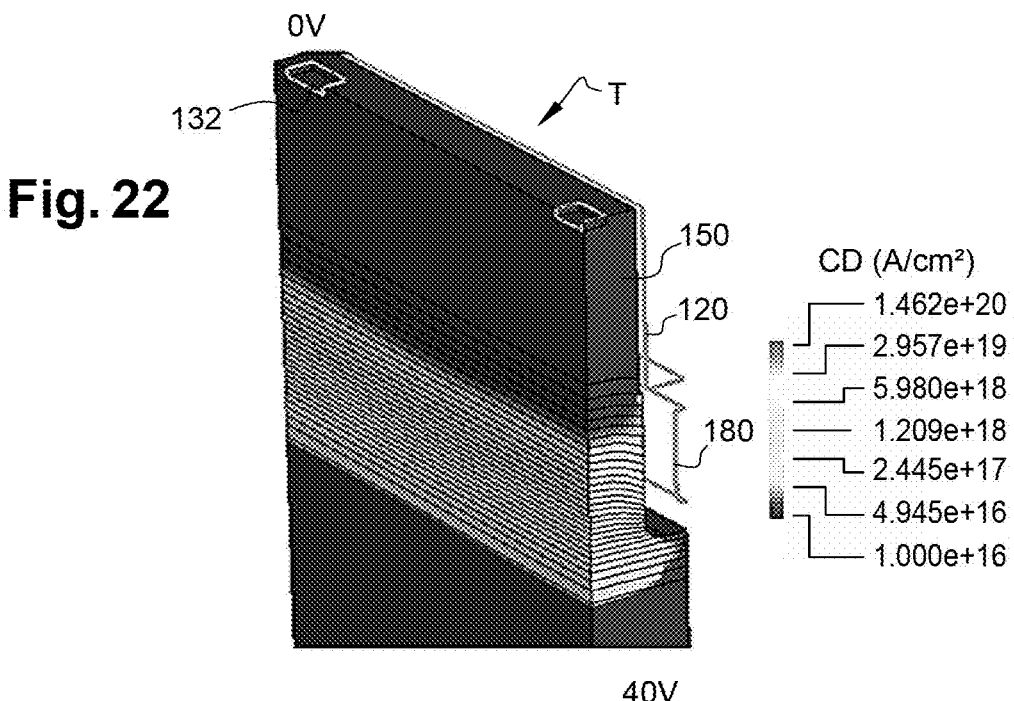
Figure 23:
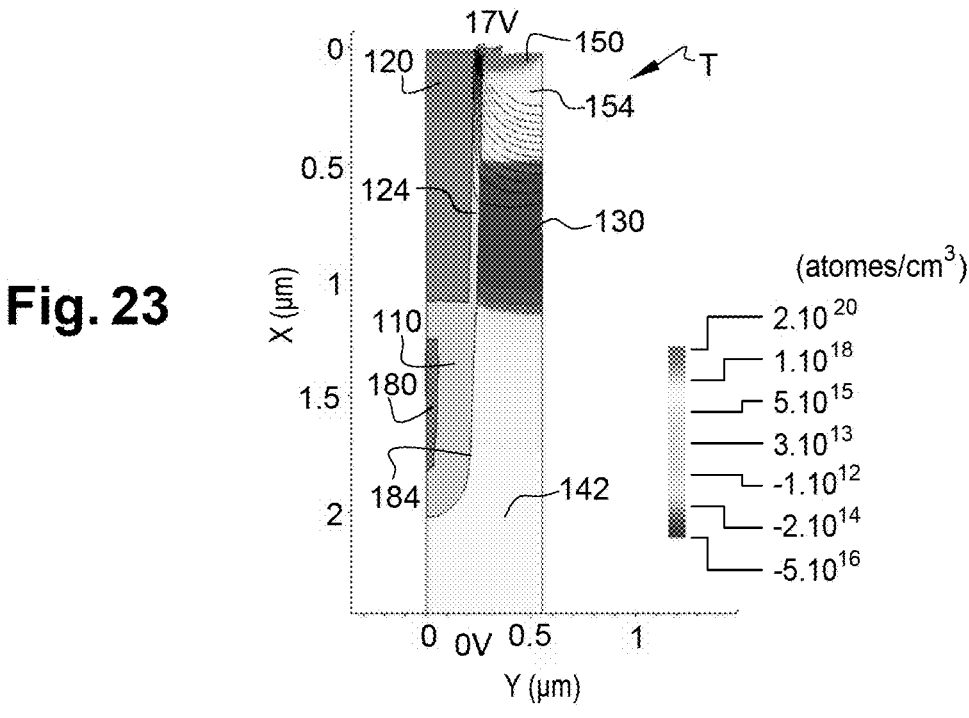

FIG. 3B is another partial simplified lateral cross-section view, similar to FIG. 1B, illustrating an embodiment of the connections of the transistor gates;

FIG. 4 is a partial simplified top view illustrating an embodiment of the transistor connections;

FIG. 5 is a partial simplified top view illustrating another embodiment of the transistor connections;

FIG. 6 illustrates a step of an embodiment of a method of manufacturing the device shown in FIGS. 1A to 1D and 2;

FIG. 7 illustrates another step of the method;

FIG. 8 illustrates another step of the method;

FIG. 9 illustrates another step of the method;

FIG. 10 illustrates another step of the method;

FIG. 11 illustrates another step of the method;

FIG. 12 illustrates, in three views, another step of the method;

FIG. 13 illustrates, in three views, another step of the method;

FIG. 14 illustrates, in three views, another step of the method;

FIG. 15 is a cross-section perspective view of the device shown in FIGS. 1A to 1D illustrating an example of the variation of the dopant concentration;

FIG. 16 is a view similar to FIG. 15 along another direction;

FIG. 17 shows curves of the variation of dopant concentrations obtained at the manufacturing steps implemented to obtain the dopant concentrations illustrated in FIGS. 15 and 16;

FIG. 18 shows a curve of the variation of the on-state resistance Ron of a transistor of the device shown in FIGS. 1A to 1D;

FIG. 19 is a cross-section view of the device shown in FIGS. 1A to 1D illustrating the variation of the current density in a first configuration of use;

FIG. 20 is a cross-section perspective view of the device shown in FIGS. 1A to 1D illustrating the variation of the current density in the first configuration of use;

FIG. 21 is a view similar to FIG. 19 in a second configuration of use;

FIG. 22 is a view similar to FIG. 20 in the second configuration of use;

FIG. 23 is a view similar to FIG. 19 in a third configuration of use; and

Figure 24:
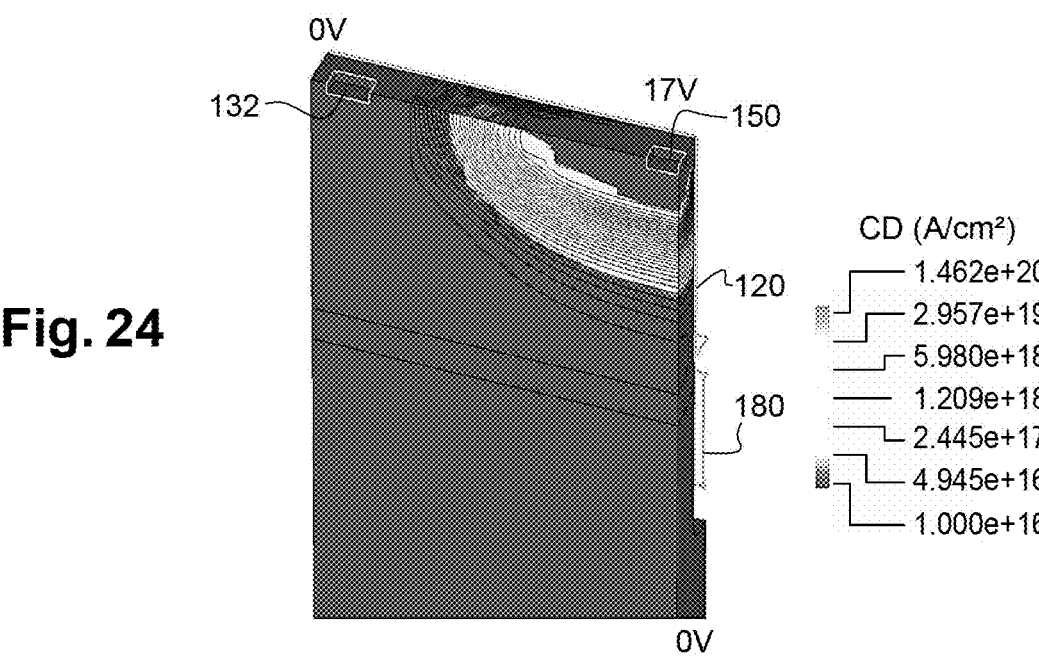

FIG. 24 is a view similar to FIG. 20 in the third configuration of use.

DETAILED DESCRIPTION

Like features have been designated by like references in the various figures. In some embodiments, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In some embodiments, mask manufacturing steps, doping steps, and step of manufacturing terminals electrically connected to doped areas are not detailed, the described embodiments being compatible with such usual steps.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, it is here considered that the terms "insulating" and "conductive" respectively mean "electrically insulating" and "electrically conductive".

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal," "vertical," etc., it is referred, unless specified otherwise, to the orientation of the drawings or to a display screen in a normal position of use.

Unless specified otherwise, the expressions "around," "approximately," "substantially" and "in the order of" signify within 10%, and in some embodiments within 5%. Unless specified otherwise, ordinal numerals such as "first," "second," etc., are only used to distinguish elements from one another. In some embodiments, these adjectives do not limit the described embodiments to a specific order of these elements.

Figure 1C:
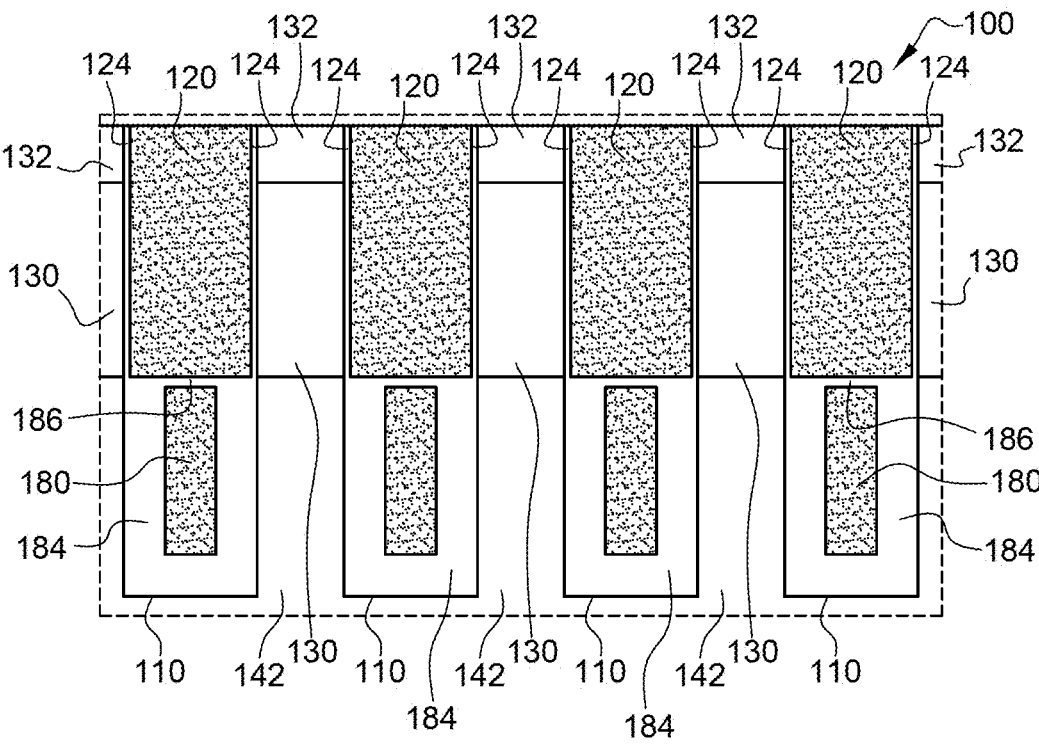
FIG. 1C is another partial simplified lateral cross-section view of the device of FIG. 1A.
Figure 1D:
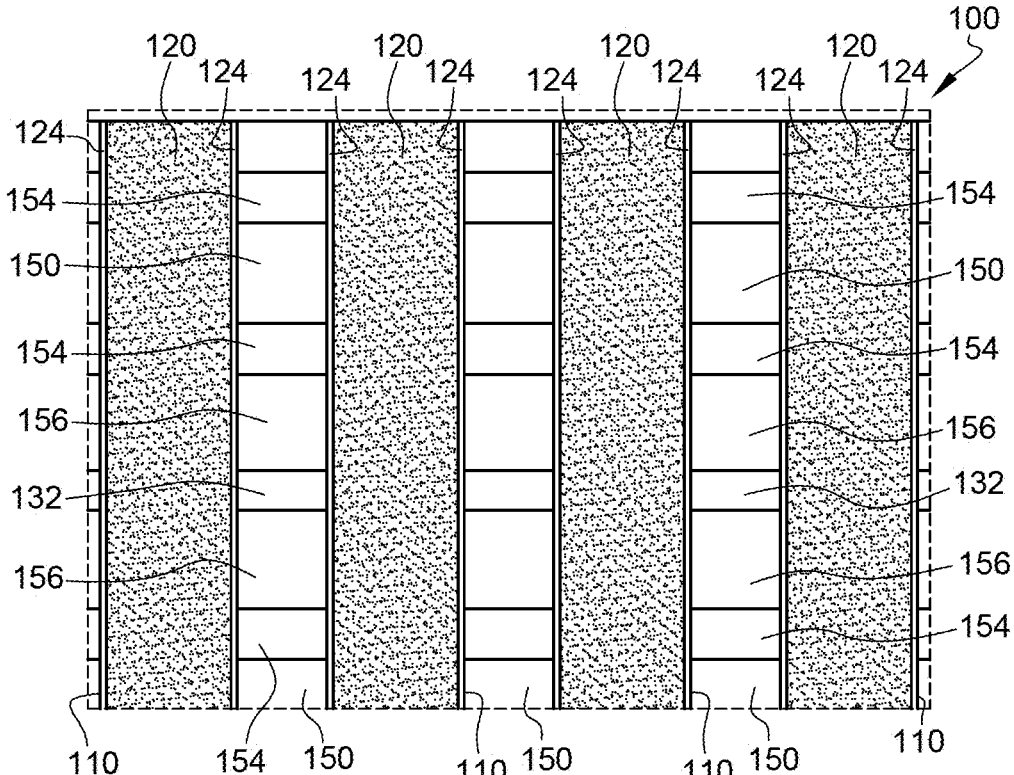
FIG. 1D is a partial simplified top view of the device of FIG. 1A.
Figure 2:
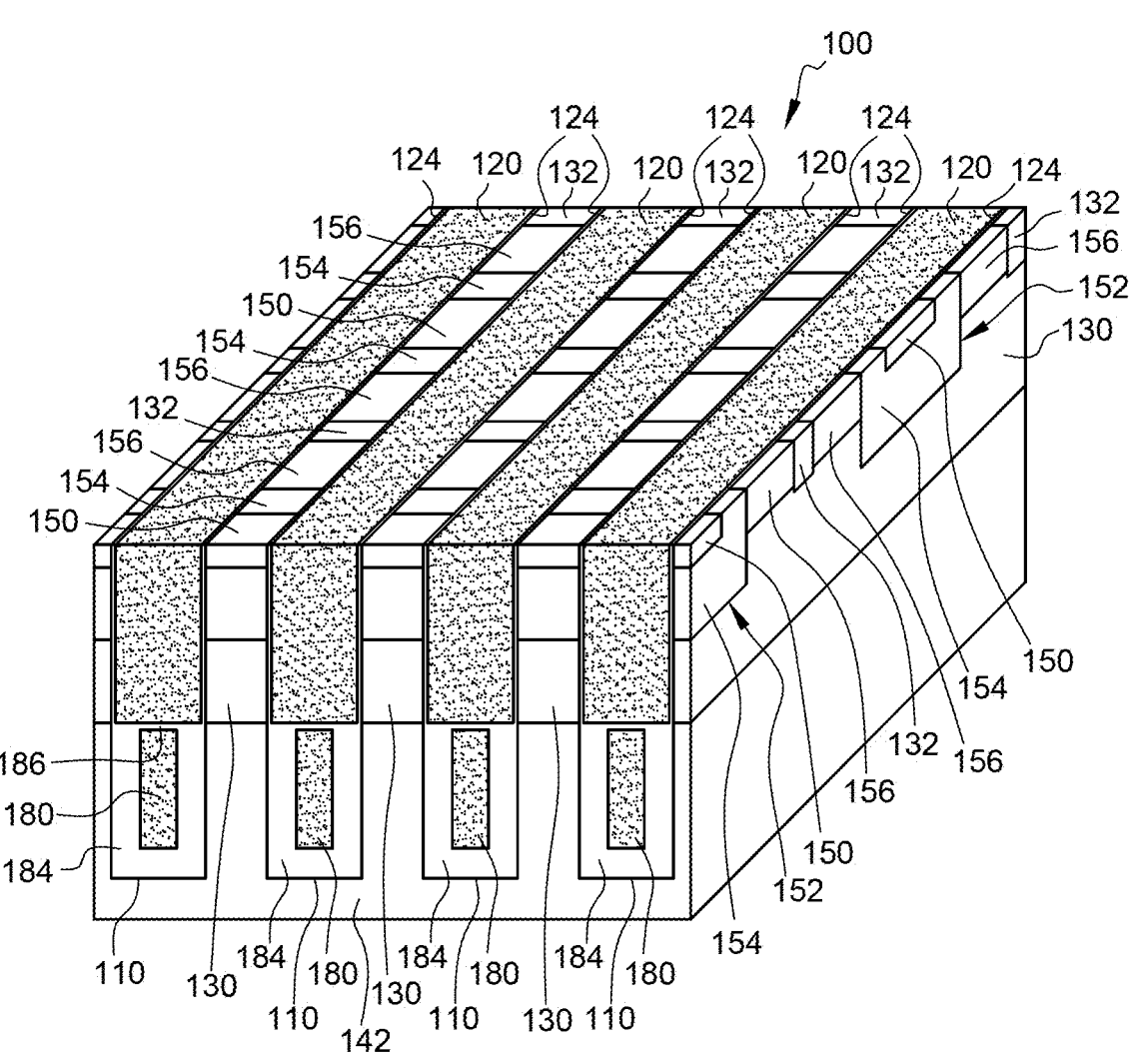
FIG. 2 is a partial simplified cross-section perspective view of the device of FIGS. 1A to 1D.

FIGS. 1A, 2B, 1C, and 1D partially and schematically show respectively, cross-section views and a top view, and FIG. 2 is a perspective view of an embodiment of a device 100 comprising a plurality of transistors T. Cross-section views 1B and 1C have, as respective cross-section planes, parallel planes 1B-1B and 1C-1C. Transistors T are partially shown in FIGS. 1A to 1D and 2.

Device 100 is, for example, an electronic integrated circuit, defined by a semiconductor substrate 102 comprising a front side 104 and a back side 106, not shown in FIGS. 1A to 1D and 2 and shown in FIGS. 3A and 3B described hereinafter, opposite to front side 104, and transistors T located inside and on top of substrate 102.

Transistors T are delimited by trenches 110, four parallel trenches 110 being shown as an example in FIGS. 1B to 1D and 2. Each trench 110 extends in substrate 102 from front side 104 across a portion of the thickness of substrate 102.

Each transistor T particularly comprises:

a gate 120 located in one of trenches 110;

a doped semiconductor well 130 of a first conductivity type, buried in substrate 102, separated from gate 120 by a gate insulator 124, and inside of which the channel of transistor T forms in operation. Well 130 is coupled to front side 104 by a semiconductor contacting area 132 extending in substrate 102 from front side 104;

doped drain/source semiconductor areas 140 and 150, doped with a second conductivity type, opposite to the first conductivity type, and located on either side of well 130. Doped area 140, also called drain region, not shown in FIGS. 1A to 1D and 2 and shown in FIGS. 3A and 3B described hereafter, is in contact with the back side 106 of substrate 102, and doped area 150, also called source region, is in contact with the front side 104 of substrate 102; and semiconductor regions 142, 152 called drift regions, doped with the second conductivity type and less heavily doped than doped areas 140 and 150. Drift region 142 is interposed between doped area 140 and well 130 and semiconductor region 152 is interposed between doped area 150 and well 130.

Each transistor T defined by the above-described elements thus forms a field-effect transistor, that is, an electronic component capable, according to a control voltage applied between gate 120 and source region 150, to form, in well 130, a conductive channel electrically connecting drain and source regions 140 and 150.

The gate 120 of each transistor T comprises at least one electrically-conductive region extending in one of trenches 110, such as for example a metal and/or doped polysilicon, a lateral wall of trench 110 forming a lateral surface of the well 130 of transistor T. Gate insulator 124, covering the lateral wall of trench 110, is in contact with well 130 and with the conductive region of gate 120. Gate insulator 124 is typically formed of one or a plurality of dielectric layers, for example, the gate insulator is formed of a silicon oxide layer. The thickness of gate insulator 124 is typically smaller than 15 nm, in some embodiments in the range from 20 nm to 40 nm.

The number and the dimensions of trenches 110 depend on the envisaged application. The depth of each trench 110 may be in the range from 1.7 μm to 2.5 μm, for example, equal to approximately 2 μm. As an example, each trench 110 may have a width in the range from 0.1 μm to 1 μm, for example, equal to 0.6 μm. In some embodiments, trenches 110 extend at least partly along directions parallel to a same direction, called longitudinal trench direction hereafter, and are regularly spaced apart. Hereafter, the expression lateral trench direction designates the direction perpendicular to the longitudinal trench direction. The trench pitch along the lateral trench direction may be in the range from 0.9 μm to 1.2 μm. The number of trenches 110 may vary from 1000 to 3000. The length of each trench 110 along the longitudinal trench direction may vary from 0.5 μm to 3 μm.

According to an embodiment, as shown in FIGS. 1B and 2, each trench 110 of an assembly of parallel adjacent trenches 110, possibly except for the trenches 110 located at the two opposite edges of trench assembly 110, delimits transistors T on either side of trench 110. According to an embodiment, as shown in FIGS. 1D and 2, for each trench 10, the gates 120 contained in trench 110 are connected to one another and form a gate 120 common to the transistors T which are delimited by this trench 110. According to an embodiment, for each trench 110, the semiconductor wells 130 of the transistors T which are delimited by this trench 110 and located on a same side of this trench 110 meet and form a continuous semiconductor well 130.

In an example, substrate 102 is formed by a semiconductor wafer, for example, a silicon wafer. In another example, the substrate is formed by a layer located on the surface of a semiconductor wafer, for example, an epitaxial layer on a semiconductor wafer. In some embodiments, substrate 102 is a single-crystal substrate.

According to an embodiment, as shown in FIGS. 1B and 1C, each well 130 located between first and second adjacent trenches 110 extends from the first trench 110, in contact with the gate insulator 124 covering the lateral wall of the first trench 110, all the way to the second trench, in contact with the gate insulator 124 covering the lateral wall of the second trench 110. The depth, measured from front side 104, of contacting area 132 may be in the range from 0.4 μm to 0.8 μm. The maximum depth, measured from front side 104, of well 130 may be in the range from 0.8 μm to 1.2 μm. The thickness, measured along a direction orthogonal to front side 104, of well 130 under drift region 152 may be in the range from 0.5 μm to 0.8 μm. The maximum thickness, measured along a direction orthogonal to front side 104, of well 130 may be in the range from 1 μm to 1.3 μm. The dimension along the longitudinal trench direction of contacting area 132 may be in the range from 0.5 μm to 1.5 μm.

According to an embodiment, as shown in FIG. 1D, each drift region 152 located between first and second adjacent trenches 110 extends from the first trench 110, in contact with the gate insulator 124 covering the lateral wall of first trench 110, to the second trench, in contact with the gate insulator 124 covering the lateral wall of second trench 110. Drift region 152 comprises a first drift sub-region 154 and two second drift sub-regions 156, connected to first drift sub-region 154. First drift sub-region 154 is less heavily doped than source region 150. Second drift sub-regions 156 are less heavily doped than source region 150 and in some embodiments less heavily doped than first drift sub-region 154. Each of the first drift sub-region 154 and of the second drift sub-regions 156 located between the first and second adjacent trenches 110 extends from the first trench 110, in contact with the gate insulator 124 covering the lateral wall of the first trench 110, all the way to the second trench, in contact with the gate insulator 124 covering the lateral wall of the second trench 110. Source region 150 is contained in first drift sub-region 154. First drift sub-region 154 entirely covers the bottom of source region 150. First drift sub-region 154 entirely covers the lateral walls of source region 150 between the first and second trenches 110. Second drift sub-regions 156 are located on either side of first drift sub-region 154 along the longitudinal trench direction. Each second drift sub-region 156 extends, along the longitudinal trench direction, from first drift sub-region 154 to the adjacent contacting area 132. Each second drift sub-region 156 may be exposed on the front side 104 of substrate 102. In some embodiments, source region 150 extends from the first trench 110, in contact with the gate insulator 124 covering the lateral wall of the first trench 110, all the way to the second trench, in contact with the gate insulator 124 covering the lateral wall of the second trench 110.

The depth of first drift sub-region 154 may be in the range from 0.4 μm to 0.6 μm. The depth of each second drift sub-region 156 may be in the range from 0.3 μm to 0.6 μm. The maximum dimension along the longitudinal trench direction of drift region 152 may be in the range from 2 μm to 5 μm. The dimension along the longitudinal trench direction of first drift sub-region 154 may be in the range from 1.5 μm to 4 μm. The dimension along the longitudinal trench direction of each second drift sub-region 156 may be in the range from 0.5 μm to 1 μm. The depth, measured from first surface 104, of source region 150 may be in the range from 0.2 μm to 0.4 μm.

As an example, transistor T is of N-channel type. Thus, doped areas 140 and 150 are N-type doped. Well 130 is P-type doped. However, in the described embodiments, the N and P conductivity types, or doping types, may be exchanged. Operations similar to those described are then obtained by exchanging the signs of the voltages in the device.

In some embodiments, the doping levels of areas 140 and 150 are high, that is, greater than $5*10^{18}$ atoms/cm$^3$, in some embodiments, greater than $10^{19}$ atoms/cm$^3$. Contacting are 132, electrically connected to well 130, is a doped area also having such a high doping level. The doping level of well 130 is in some embodiments smaller than $10^{18}$ atoms/cm$^3$, and in some embodiments smaller than $5*10^{17}$ atoms/cm$^3$. Each drift region 142, 152 has a doping level lower than that of doped area 150. In some embodiments, each semiconductor region 142, 152 has a low doping level, that is, lower than $2*10^{17}$ atoms/cm$^3$. This doping level is in some embodiments greater than $5*10^{16}$ atoms/cm$^3$. According to an embodiment, each first drift sub-region 154 has a doping level in the range from $2*10^{17}$ atoms/cm$^3$ to $6*10^{17}$ atoms/cm$^3$. According to an embodiment, each second drift sub-region 156 has a doping level in the range from $3*10^{16}$ atoms/cm$^3$ to $1*10^{17}$ atoms/cm$^3$.

Device 100 may further comprise, for each trench 110, an electrically-conductive element 180 located in trench 110. Conductive element 180 is connected to a terminal, not shown in FIGS. 1A to 1D and 2. This terminal is in some embodiments connected to contacting areas 132. Conductive element 180 is located opposite at least a portion of semiconductor region 142, that is, conductive element 180 is located against an insulator 184 covering the lateral wall surface of at least a portion of semiconductor region 142. Insulating layer 184 separates conductive element 180 from semiconductor region 142, corresponding to the thickness of insulating layer 184, is for example in the range from 100 nm to 200 nm, in some embodiments in the range from 120 nm to 180 nm. Insulating layer 184 in some embodiments has a thickness greater than that of gate insulator 124. As an example, insulating layer 184 is made of silicon oxide or of silicon nitride.

At the bottom of trench 110, an insulating portion, in some embodiments a portion of insulating layer 184, is located under conductive element 180. This portion electrically insulates conductive element 180 from the portion of substrate 102 located under conductive element 180. Further, insulating layers 186, in some embodiments made of the same material or materials as gate insulator 124, electrically insulate conductive element 180 from gate 120.

In some embodiments, conductive element 180 is formed by a conductive wall located in a central portion of trench 110. The wall extends in the same direction as the trench. The wall extends in substrate 102 orthogonally to the front side 104 of the substrate. As an example, the wall comprises, in some embodiments is made of, a metallic material or, in some embodiments, doped polysilicon. The width of the conductive wall, taken in the transverse direction of the trench, is for example in the range from 30 nm to 200 nm.

Device 100 further comprises conductive tracks and conductive vias, not shown in FIGS. 1A to 1D and 2, of at least one metallization level formed on the front side 104 of substrate 102 for the connection of the sources, of the gates, and of the wells of transistors T. According to an embodiment, the source regions 150 of the assembly of the MOS transistors are connected together. According to an embodiment, the gates 120 present in trenches 110 are connected together. According to an embodiment, the contacting areas 132 of wells 30 are connected together.

FIGS. 3A and 3B are views similar respectively to FIGS. 1A and 1B illustrating an embodiment of the connections of transistors T.

As an example, device 100 is shown in FIGS. 3A and 3B with two metallization levels N1 and N2. The first metallization level N1 comprises an insulating layer 190 covering the front side 104 of substrate 102, metal tracks 192 extending on insulating layer 190, and conductive vias 194 crossing insulating layer 190 and connecting metal tracks 192 particularly to gates 120, to source regions 150, and to contacting areas 132. The second metallization level N2 comprises an insulating layer 200 covering conductive tracks 192 and insulating layer 190 between conductive tracks 192, metal tracks 202 extending on insulating layer 200, and conductive vias 204 crossing insulating layer 200 and connecting metal tracks 202 to at least some of metal tracks 192.

The number of transistors T assembled in parallel depends on the targeted application. According to an embodiment, device 100 comprises from $3*10^5$ to $3*10^6$ transistors T.

FIG. 4 is a top view of an embodiment illustrating a layout of the conductive tracks 192 of the first metallization level which have the shape of parallel strips and of plates. FIG. 4 further shows the limits of trenches 110, of contacting areas 132, and of source regions 150. Conductive vias 194 are further shown by squares possibly crossed by a horizontal line. In the present embodiment, trenches 110 are parallel and extend with no interruption over the entire region where the transistors are formed. As shown in FIG. 4, conductive tracks 192 are distributed into conductive plates 192_S coupled to source regions 150 by conductive vias 194_S, conductive tracks 192_B coupled to contacting areas 132 by vias 194_B, a conductive track 192_G coupled to gates 120 by vias 194_G, and a conductive track 192_M coupled to conductive elements 180 by vias 194_M. In the present embodiment, plates 192_S are alternated with strips 192_B. The conductive tracks 202 of the second metallization level, not shown in FIG. 4, may be used for the connection of conductive plates 192_S.

FIG. 5 is a top view of an embodiment illustrating a layout of the conductive tracks 192 of the first metallization level which have the shape of parallel strips and of plates. FIG. 4 further shows the limits of trenches 110, of contacting areas 132, and of source regions 150. In the present embodiment, trenches 110 are parallel and extend and are distributed into assemblies 112 of trenches 110 on the region where the transistors are formed, each assembly 112 of trenches comprises first and second groups 114, 116 of trenches 110, the trenches of the first group 114 being offset along the transverse trench direction with respect to the trenches 110 of the second group 116 by half the pitch of the trenches, the trenches of the first and second groups being coupled at one end to a trench 118 extending along the transverse trench direction. Conductive vias 194 are shown by squares possibly crossed by a horizontal line. As shown in FIG. 5, conductive tracks 192 are distributed into conductive plates 192_S coupled to source regions 150 by conductive vias 194_S, conductive tracks 192_MB coupled to contacting areas 132 and to conductive elements 180 by vias 194_MB. The connection of gates 120 can be made in a zone outside of FIG. 5.

As an example, for an application in the field of high power integrated relays, the drain of transistors T may be taken in operation to a potential in the range from 40 V to 45 V. When transistors T are in the on state, the voltage between the gate and the source of each transistor T is approximately 10 V and the potential at the source is approximately 40 V-45 V. When transistors T are in the non-conductive state, the voltage between the gate and the source of each transistor T is approximately 0 V and the potential at the source is approximately 0 V. The contacting areas 132 of wells 130 are set to 0 V and conductive elements 180 are set to 0 V.

The presence of conductive elements 180 advantageously enables to decrease the intensity of the electric field present in operation at the level of the P-N junctions. This enables to increase the dopant concentration of drift region 142 and 152 while ensuring for the transistor not to be deteriorated on application of maximum voltages.

FIGS. 6 to 14 are partial simplified cross-section views of the structures obtained at steps of an embodiment of a method of manufacturing the device 100 of FIGS. 1A to 1D. For FIGS. 12, 13, and 14, three cross-section views A, B, and C similar to cross-section views 1A, 1B, and 1C have been shown.

FIG. 6 shows the structure obtained after the forming in substrate 102 of heavily-doped drain region 140 of the second conductivity type, for example, N-type doped, and of a semiconductor layer 210 more lightly doped than drain region 140, having a dopant concentration substantially corresponding to the dopant concentration desired for drift region 142. Substrate 102 may be manufactured by the forming, on a heavily-doped silicon wafer, which corresponds to drain region 140, of more lightly-doped silicon semiconductor layer 210, for example, by epitaxy.

FIG. 7 shows the structure obtained after the forming of trenches 110 in the layer 310 of substrate 102. Trenches 110 may be formed by an etch step.

FIG. 8 shows the structure obtained after the forming, on the walls and the bottom of each trench 110, of an insulating layer 212. The method may comprise a conformal deposition of an insulating layer covering the structure resulting from the etching of trenches 110. The composition and the thickness of insulating layer 212 correspond to the composition and the thickness desired for insulating layer 184. As a variant, insulating layer 212 may be formed by a thermal oxidation step.

FIG. 9 shows the structure obtained after the forming in each trench 110 of a conductive core 214. The method may comprise the deposition of a conductive layer, for example, made of polysilicon, covering insulating layer 212 and filling the remaining space of each trench 110, and the removal, for example, by etching, of portions of the conductive layer located outside of trenches 110. The composition of conductive cores 214 corresponds to the desired composition of conductive elements 180.

FIG. 10 shows the structure obtained after the etching, across part of the depth of each trench 110, of insulating layer 212 and of conductive core 214. The conductive elements 180 and the insulating layers 184 of the transistors are thus formed.

FIG. 11 shows the structure obtained after the forming, in each trench 110, of insulating layer 186, of gate insulator 124, and of gate 120. Gate insulator 124 may be formed by thermal oxidation. The method may comprise a deposition of a conductive layer covering the insulating layer and filling the remaining space of each trench 110, and the removal, for example, by etching, of the portions of the conductive layer located outside of trenches 110.

FIG. 12 shows, in cross-section views 12A, 12B, and 12C, the structure obtained after a step of implantation of dopants of the first conductivity type, for example, of type P, to form the wells 130 of the transistors, buried in substrate 102.

FIG. 13 shows, in cross-section views 13A, 13B, and 13C, the structure obtained after a first step of implantation of dopants of the second conductivity type, to form, in each transistor T, the first drift sub-region 154, and a second step of implantation of dopants of the second conductivity type to form, for each transistor T, source region 150.

FIG. 14 shows, in cross-section views 14A, 14B, and 14C, the structure obtained after a step of implantation of dopants of a first conductivity type to form contacting areas 132. This further delimits, for each transistor T, second drift sub-regions 156 of drift regions 152. Transistors T are thus formed.

The method carries on with the forming of the metallization levels.

FIGS. 15 and 16 are cross-section perspective views along two different directions illustrating the variation of the dopant concentration in grayscale in the device 100 of FIGS. 1A to 1D manufactured according to the embodiment of the manufacturing method previously described in relation with FIGS. 6 to 14 with the dopant concentration profiles illustrated in FIG. 17. In FIGS. 15 and 16, the shade of gray is all the darker as the concentration of N- or P-type dopants is high. In FIGS. 15 and 16, only semiconductor substrate 102 is shown and the elements of a single transistor T are partially shown. The contours of gate 120, of conductive element 180, and of vias 194 connected to source region 150 and the contacting area 132 of transistor T are further partially shown.

In FIG. 17, curves C1, C2, C3, and C4 are profiles of the dopant concentrations, expressed in atoms/cm$^3$, in substrate 102 according to the depth measured from front side 104 at the level of a source region 150. For example, substrate 102 may be manufactured by the forming, on a silicon wafer heavily doped with arsenic (N-type dopant), which corresponds to drain region 140, of semiconductor silicon layer 210 more lightly doped with phosphorus (N-type dopant), for example, by epitaxy. Curve C1 is the curve of variation of the arsenic concentration present in substrate 102 and curve C2 is the curve of variation of the concentration of phosphorus originating from the forming of layer 210. Curve C3 is the curve of variation of the boron concentration (P-type dopant) obtained after the implantation step for the forming of well 130. Curve C4 is the curve of variation of the phosphorus concentration obtained after the implantation step for the forming of first drift sub-region 154. The curve, not shown in FIG. 5, of variation of the concentration of phosphorus obtained after the step of implantation of phosphorus for the formation of source region 150 comprises a peak at about $2*10^{19}$ atoms/cm$^3$ for a depth of about 50 nm and drops at less than $1*10^{15}$ atoms/cm$^3$ for a depth superior to 350 nm. As shown in FIGS. 15 and 16, the N-type dopant concentration varies continuously between the first and second drift sub-regions 154, 156 and source region 150.

Simulations have been performed for the device 100 shown in FIGS. 1A to 1D to highlight the properties of transistors T. For the simulations, device 100 had the dopant concentrations previously described in relation with FIGS. 15 to 17. The simulations correspond to situations of normal operation of transistor T and to conditions of unfavorable potentials for the P-N junctions of transistor T. The simulations have been performed for a 25° C. temperature.

FIG. 18 shows a curve of variation of the current density CD, expressed in A/cm$^2$, according to the drain voltage Vd, expressed in volts, flowing through the drain region 140 of transistor T in the on state. FIGS. 19, 21, and 23 are lateral cross-section views of a portion of a transistor T and FIGS. 20, 22, and 24 are cross-section perspective views of a portion of a transistor T. FIGS. 19, 20, 22, and 24 illustrate in grayscale the variation of the current density in different configurations of use of transistor T. For FIGS. 19, 20, 22, and 24, current density CD is expressed in A/cm$^2$ and the shade of gray is all the darker as the current density takes extreme high or extreme low values. For FIGS. 20, 22, and 24, current density CD is expressed in A/cm$^2$. FIGS. 21 and 23 show equipotential lines in different configurations of use of transistor T. In FIGS. 21 and 23, the dopant concentration in moreover illustrated in grayscale, the shade of gray being all the darker as the concentration of N- or P-type dopants is high.

FIGS. 18 to 20 illustrate a first simulation where transistor T is in the on state. The drain of transistor T was at a potential of approximately 40 V, the voltage between the gate and the source of transistor T was approximately 10 V, and the potential at the source of transistor T was approximately 40 V. An on-state resistance Ron, substantially equal to 6.3 mohms·mm$^2$, has been determined. The presence of contacting areas 132 cause no excessive degradation of on-state resistance Ron with respect to a structure where the source region would extend all along the trench.

FIGS. 21 and 22 illustrate a second simulation where transistor T is in the non-conductive state and the biasing conditions of the P-N junction between well 130 and drift region 142 are the most unfavorable. The drain of transistor T is at a potential of approximately 40 V, the voltage between the gate and the source of transistor T was approximately 0 V, and the potential at the source of transistor T was approximately 0 V. The P-N junction formed between well 130 and drift region 142 is reverse-biased and withstands the applied potentials.

FIGS. 23 and 24 illustrate a third simulation where transistors T are in the non-conductive state and the biasing conditions of the junction between well 130 and drift region 152 are the most unfavorable. The drain of each transistor T was at a potential of approximately 0 V, the voltage between the gate and the source of each transistor T was approximately 0 V, and the potential at the source of each transistor T was approximately 17 V. The P-N junction formed between well 130 and drift region 152 is reverse-biased and withstands the applied potentials.

The previously-described transistors T advantageously enable to withstand the voltage in the non-conductive state both for a positive drain-source voltage and a negative drain-source voltage.

Various embodiments and variants have been described. Those skilled in the art will understand that certain features of these various embodiments and variants may be combined and other variants will occur to those skilled in the art. In some embodiments, transistors T have been described with a drain region 140 located on the back side. As a variant, drift region 142 may be in contact with a more heavily-doped contacting area located on the front side.

Finally, the practical implementation of the embodiments and variants described herein is within the capabilities of those skilled in the art based on the functional indications provided hereinabove.

Electronic device (100) may be summarized as including a semiconductor substrate (102) having a first surface (104) and transistors (T) having their gates (120) contained in trenches (110) extending in the semiconductor substrate, each transistor including, in the semiconductor substrate, a doped semiconductor well (130) of a first conductivity type, having the transistor channel forming therein in operation, the well being buried in the semiconductor substrate and in contact with two adjacent trenches among said trenches, a first doped semiconductor region (152) of a second conductivity type, opposite to the first conductivity type, covering the well, in contact with the well, and in contact with the two adjacent trenches, a second doped semiconductor region (150) of the second conductivity type more heavily doped than the first semiconductor region, extending in the first semiconductor region and exposed on the first surface, and a third doped semiconductor region (132) of the first conductivity type, more heavily doped than the well, covering the well, exposed on the first surface, in contact with the first region, and extending in the semiconductor substrate in contact with the well.

The second semiconductor region (152) may be in contact with the two adjacent trenches.

The third semiconductor region (132) may be in contact with the two adjacent trenches.

The first semiconductor region (152) may include a first semiconductor sub-region (154) containing the second semiconductor region (152) and at least one second semiconductor sub-region (156) exposed on the first surface (104) and coupling the first semiconductor sub-region to the third semiconductor region (132), the maximum depth of the first semiconductor sub-region being greater than the maximum depth of the second semiconductor sub-region.

Each transistor (T) may include, in the trench (110) containing the gate (120) of the transistor: a first electrically-insulating layer (124) between the gate (120) of the transistor and the semiconductor well (130) and forming the gate insulator of the transistor; an electrically-conductive element (180) located in the trench (110); a second electrically-insulating layer (184) between the electrically-conductive element and the semiconductor substrate; and a third electrically-insulating layer (186) between the electrically-conductive element and the gate.

The second semiconductor regions (150) of the transistors (T) may be electrically connected together and the third semiconductor regions (132) of the transistors (T) may be electrically connected together.

The semiconductor substrate (102) may include a second surface (106) opposite to the first surface (104), each transistor may further include, in the semiconductor substrate, a fourth doped semiconductor region (142) of the second conductivity type, covered with the well (130), in contact with the well, and a fifth doped semiconductor region (150) of the second conductivity type, more heavily doped than the fourth semiconductor region, and exposed on the second surface.

Electronic device, may include a plurality of transistors (T) for each pair of adjacent trenches (110), at least some of the third semiconductor regions (132) of the transistors being alternated with the second semiconductor regions (150) of the transistors.

The wells (130) of two adjacent transistors (T) may meet.

Method of manufacturing the electronic device (100), wherein the forming of the first semiconductor region (152) may be summarized as including a step of forming, by epitaxy, of a doped semiconductor layer (210) of the second conductivity type, and a step of implantation of dopants of the second conductivity type in the semiconductor layer.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
   a semiconductor substrate having a first surface; and
   transistors having their gates contained in trenches extending in the semiconductor substrate, each transistor including, in the semiconductor substrate:
   a doped semiconductor well of a first conductivity type, having a transistor channel therein, the doped semiconductor well being buried in the semiconductor substrate and in contact with two adjacent trenches among the trenches,
   a first doped semiconductor region of a second conductivity type, opposite to the first conductivity type, in the doped semiconductor well, in contact with the doped semiconductor well, and in contact with the two adjacent trenches, a second doped semiconductor region of the second conductivity type more heavily doped than the first doped semiconductor region, extending in the first doped semiconductor region and exposed on the first surface, and a third doped semiconductor region of the first conductivity type, more heavily doped than the doped semiconductor well, in the doped semiconductor well, exposed on the first surface, in contact with the first doped semiconductor region, and extending in the semiconductor substrate in contact with the doped semiconductor well.

2. The electronic device according to claim 1, wherein the second doped semiconductor region is in contact with the two adjacent trenches.

3. The electronic device according to claim 1, wherein the third doped semiconductor region is in contact with the two adjacent trenches.

4. The electronic device according to claim 1, wherein the first doped semiconductor region comprises a first semiconductor sub-region containing the second doped semiconductor region and at least one second semiconductor sub-region exposed on the first surface and coupling the first semiconductor sub-region to the third doped semiconductor region, a maximum depth of the first semiconductor sub-region being greater than a maximum depth of the second semiconductor sub-region.

5. The electronic device according to claim 1, wherein each transistor includes, in a trench containing the gate of the transistor:

a first electrically-insulating layer between the gate of the transistor and the doped semiconductor well;

an electrically-conductive element located in the trench;

a second electrically-insulating layer between the electrically-conductive element and the semiconductor substrate; and a third electrically-insulating layer between the electrically-conductive element and the gate.

6. The electronic device according to claim 1, wherein the second doped semiconductor regions of the transistors are electrically coupled together and wherein the third doped semiconductor regions of the transistors are electrically coupled together.

7. The electronic device according to claim 1, wherein the semiconductor substrate includes:

a second surface opposite to the first surface, each transistor further including, in the semiconductor substrate, a fourth doped semiconductor region of the second conductivity type, on the doped semiconductor well, in contact with the doped semiconductor well; and a fifth doped semiconductor region of the second conductivity type, more heavily doped than the fourth semiconductor region, and exposed on the second surface.

8. The electronic device according to claim 1, wherein for each two adjacent trenches, at least some of the third doped semiconductor regions of the transistors are alternated with the second doped semiconductor regions of the transistors.

9. The electronic device according to claim 8, wherein the doped semiconductor wells of two adjacent transistors of the transistors meet.

10. A structure, comprising:

a substrate;

a trench extending into the substrate along a first direction from a first side of the substrate;

a first conductive structure and a second conductive structure in the trench, the first conductive structure and the second conductive structure aligned along the first direction with respect to one another and separated from one another along the first direction by a first insulation layer;

a first doped semiconductor region and a second doped semiconductor region each laterally adjacent to the trench, the first doped semiconductor region is at least partially contained within the second doped semiconductor region, the second doped region including a first portion in contact with the first doped semiconductor region and a second portion distal from the first doped semiconductor region, the first portion extending into the substrate deeper than the second portion; and a doped semiconductor well laterally adjacent to the trench, the first doped semiconductor region and the second doped semiconductor region each being at least partially within the doped semiconductor well.

11. The structure according to claim 10, wherein the first doped semiconductor region and the second doped semiconductor region are doped with a first conductivity type.

12. The structure according to claim 11, further comprising a third doped semiconductor region of a second conductivity type and laterally adjacent to the trench, the second doped semiconductor region being laterally between the third doped semiconductor region and the first doped semiconductor region.

13. The structure according to claim 10, further comprising a second insulation layer laterally between the second conductive structure and a first sidewall of the trench.

14. The structure according to claim 13, further comprising a third insulation layer laterally between the first conductive structure and a second sidewall of the trench, the third insulation layer and the second insulation layer having different thickness.

15. The structure according to claim 10, wherein the doped semiconductor well extends into the substrate about a same depth as the trench.

16. The structure according to claim 10, further comprising a fourth doped layer at a second side of the substrate that is opposite to the first side.

17. A method, comprising forming a trench in a semiconductor substrate;

forming a first insulation layer on a sidewall and a bottom of the trench;

forming a first conductive layer on the first insulation layer and filling the trench;

removing an upper portion of the first conductive layer and the first insulation layer;

after the removing the upper portion of the first conductive layer and the first insulation layer, forming a second insulation layer on the first conductive layer and in the trench;

forming a second conductive layer on the second insulation layer;

forming a first doped semiconductor region and a second doped semiconductor region, each laterally adjacent to the trench, the first doped semiconductor region being at least partially within the second doped semiconductor region, the second doped region including a first portion in contact with the first doped semiconductor region and a second portion distal from the first doped semiconductor region, the first portion extending into the semiconductor substrate deeper than the second portion; and forming a doped semiconductor well laterally adjacent to the trench, the first and second doped semiconductor regions each being at least partially within the doped semiconductor well.

18. The method according to claim 17, wherein the first doped semiconductor region has a first conductivity type.

19. The method according to claim 18, wherein the second doped semiconductor region has the first conductivity type.

20. The method according to claim 17, further comprising a third doped semiconductor region at least partially within the doped semiconductor well.

\* \* \* \* \*